United States Patent
Ohashi

(10) Patent No.: US 9,209,817 B2
(45) Date of Patent: Dec. 8, 2015

(54) CLOCK GENERATION CIRCUIT, DISPLAY DEVICE DRIVE CIRCUIT, AND CONTROL METHOD OF CLOCK GENERATION CIRCUIT

(75) Inventor: Katsuhisa Ohashi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 826 days.

(21) Appl. No.: 13/477,654

(22) Filed: May 22, 2012

(65) Prior Publication Data

US 2012/0299505 A1    Nov. 29, 2012

(30) Foreign Application Priority Data

May 27, 2011  (JP) .................. 2011-119141

(51) Int. Cl.
  *H05B 37/00*  (2006.01)
  *H03L 7/08*  (2006.01)
  *H03L 7/081*  (2006.01)

(52) U.S. Cl.
  CPC ............ *H03L 7/0807* (2013.01); *H03L 7/0812* (2013.01)

(58) Field of Classification Search
  CPC ..... H03L 7/0814; H03L 7/087; H03L 7/0895; H03L 7/091
  See application file for complete search history.

(56) References Cited

U.S. PATENT DOCUMENTS

| | | | |
|---|---|---|---|
| 6,104,225 A | 8/2000 | Taguchi et al. | |
| 8,013,645 B2 | 9/2011 | Kuroki et al. | |
| 8,713,238 B1* | 4/2014 | Kaliyamoorthy et al. | 710/302 |
| 2009/0051675 A1 | 2/2009 | Huang | |
| 2009/0086872 A1* | 4/2009 | Liu et al. | 375/371 |
| 2009/0213212 A1* | 8/2009 | Nakamura | 348/65 |
| 2011/0102092 A1 | 5/2011 | Raita | |

FOREIGN PATENT DOCUMENTS

| | | |
|---|---|---|
| JP | 2002-335302 A | 11/2002 |
| JP | 3945894 B2 | 7/2007 |
| JP | 2009-48154 A | 3/2009 |
| JP | 2009-278528 A | 11/2009 |
| JP | 2010-21706 A | 1/2010 |

* cited by examiner

*Primary Examiner* — Sibin Chen
(74) *Attorney, Agent, or Firm* — Foley & Lardner LLP

(57) ABSTRACT

A clock generation circuit that can reliably recover from a state in which generation of a clock is stopped even during a power-on process and a normal operation. The clock generation circuit includes a clock extraction circuit that extracts an extracted clock from an embedded signal on which a clock and data are superimposed, and a stop detection circuit that detects a stop of the extracted clock on the basis of the embedded signal and the extracted clock and outputs a reset signal that resets the clock extraction circuit to an initial state.

19 Claims, 11 Drawing Sheets

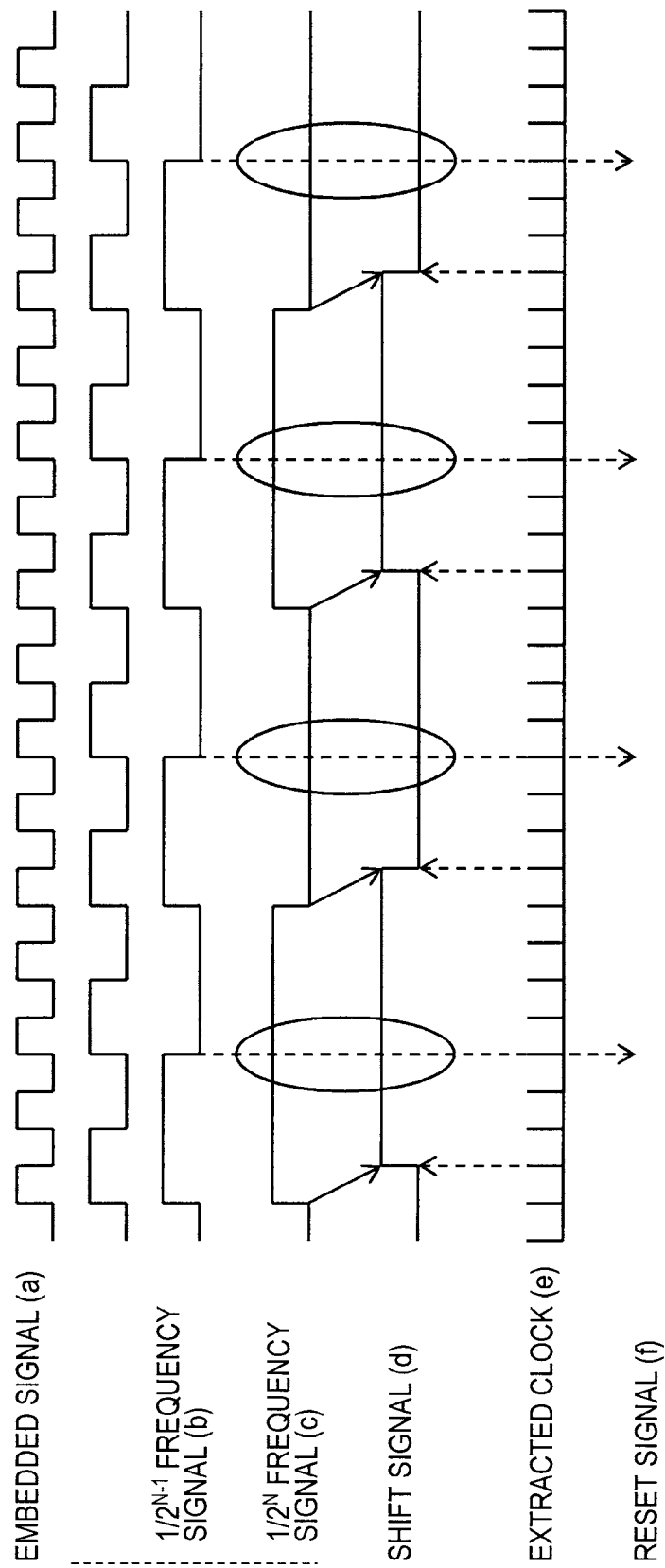

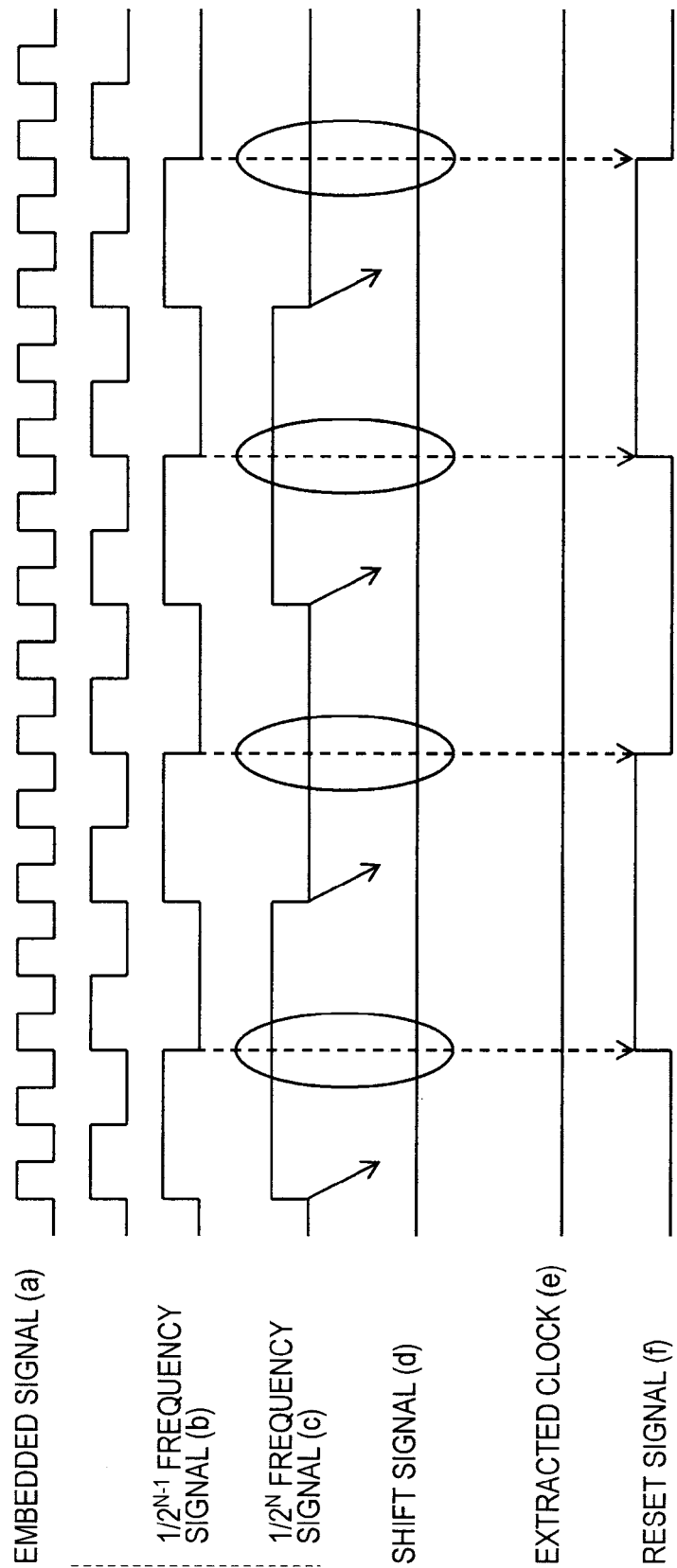

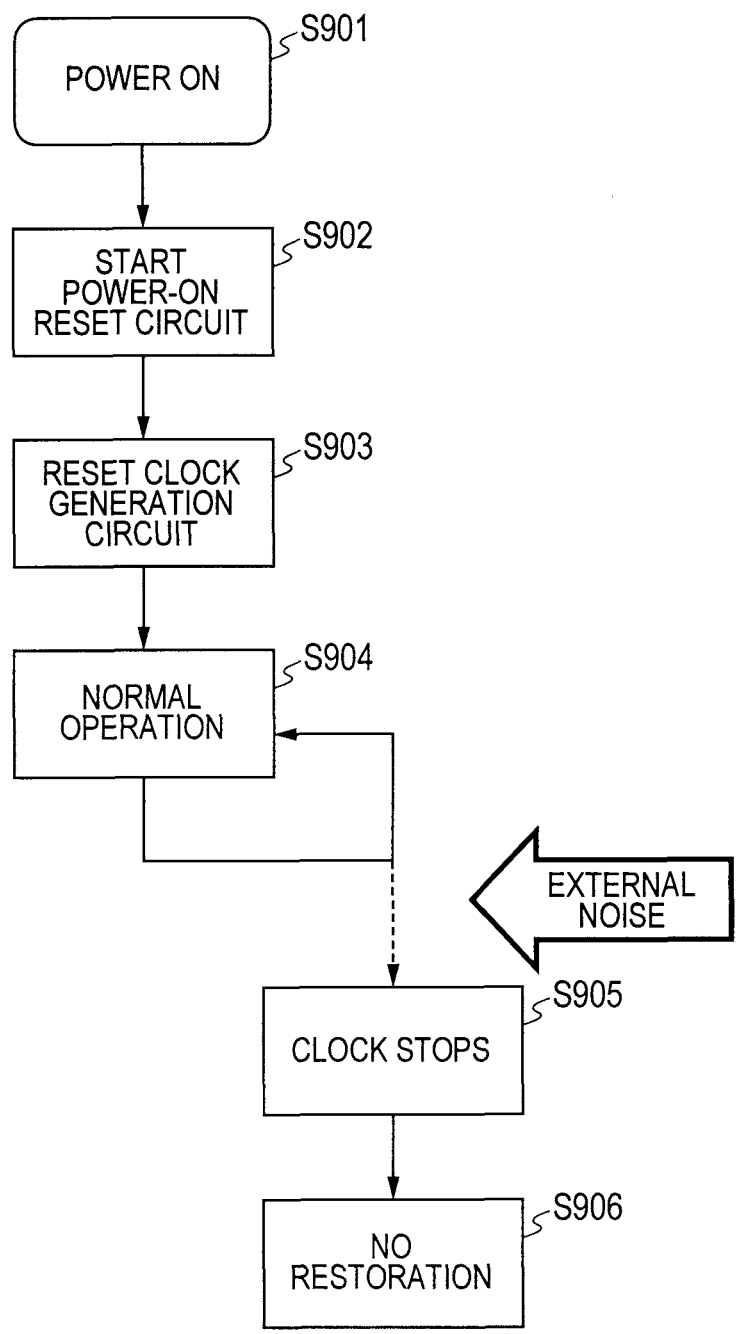

CLOCK GENERATION CIRCUIT, DISPLAY DEVICE DRIVE CIRCUIT, AND CONTROL METHOD OF CLOCK GENERATION CIRCUIT

CROSS-REFERENCE TO RELATED APPLICATIONS

The disclosure of Japanese Patent Application No. 2011-119141 filed on May 27, 2011 including the specification, drawings and abstract is incorporated herein by reference in its entirety.

BACKGROUND

The present invention relates to a clock generation circuit, a display device drive circuit, and a control method of the clock generation circuit, and in particular to a clock generation circuit, a display device drive circuit, and a control method of the clock generation circuit for generating a recovery clock from an embedded signal in which a clock is superimposed on data.

In recent years, in a high-speed serial I/F, a data transmitting/receiving method has widely spread in which a transmitting side transmits an embedded signal where a first clock of serial data is embedded in data and a receiving side extracts edge information of the first clock of the serial data from the received embedded signal, samples data by a recovery clock (reproduction clock) restored from the extracted edge of the first clock, and restores the original serial data.

In a receiving circuit of such a high-speed serial I/F, a DLL (Delay Locked Loop) is used to generate a recovery clock for extracting data on the basis of an inputted embedded signal.

As a clock generation circuit that uses a DLL, for example, Patent Documents 1 to 3 are known. The embedded signal is not described in Patent Documents 1 to 3.
[Patent Document 1]
Japanese Unexamined Patent Publication No. 2010-21706
[Patent Document 2]
Japanese Unexamined Patent Publication No. 2009-278528
[Patent Document 3]
Japanese Patent No. 3945894

SUMMARY

When a feedback control is performed on a reference signal, a DLL goes into a lock state and a delay signal is generated. Therefore, in a clock generation circuit using a DLL, if the reference signal stops, the feedback control cannot be performed, so that the generation of the clock also stops. The cause of the stopping of the reference signal may be a malfunction due to an unstable state in the clock generation circuit.

To prevent such a malfunction, a power-on reset signal for resetting a circuit when the power is turned on is described in Patent Document 3.

FIG. 10 shows a reset operation by the power-on reset signal in a clock generation circuit of the related art. When the power of the device is turned on (S901), first, a power-on reset circuit is activated and the power-on reset signal is generated (S902), an internal state of the clock generation circuit is reset by the generated power-on reset signal (S903), and then clock is generated and normal operation starts (S904).

However, in the reset by the power-on reset signal, whether the reset is performed or not may be affected and controlled by start-up condition of a power supply when the power is turned on.

FIG. 11 shows a relationship between a power supply voltage and the power-on reset signal when the power is turned on. The power-on signal is generated according to rising of voltage waveform after the power is turned on. When the gradient of the voltage waveform is moderate as shown by (a) in FIG. 11, the pulse width of the power-on reset signal is wide, and when the gradient of the voltage waveform is large as shown by (b) in FIG. 11, the pulse width of the power-on reset signal is narrow. Therefore, when the voltage waveform is sharp, the power-on reset signal is very narrow, so that the reset may not be correctly performed depending on the circuit. In this case, the clock generation circuit is not reset and the generation of the clock remains stopped. If a power-on reset signal that surely resets the circuit is to be generated from all rising waveforms of the power supply, the specification of the rising time of the power supply of a display device drive circuit needs to be defined for a display device manufacturer, so that the general versatility of the display device drive circuit is impaired. Further, the specification of the rising time of the power supply needs to be observed even in the worst condition, so that the power-on reset is effective during a time period defined by the specification. Therefore, an end user needs to wait for a time period that is only necessary during the worst condition in order to start up the device. Furthermore, even if the display device manufacturer tries to shorten the rising time of the power supply to shorten the start-up time of the display device after the power is turned on, the drive circuit does not start up during the time period defined by the specification, so that this also impairs the general versatility of the display device drive circuit.

If the circuit malfunctions after the normal operation starts, the clock cannot be normally generated only by the reset of the power-on reset signal.

FIG. 12 shows an operation in which a malfunction occurs after the power-on reset in the clock generation circuit of the related art. As shown in FIG. 10, the power is turned on, and normal operation starts after the power-on reset (S901 to S904). Thereafter, if the internal state of the circuit becomes unstable due to external noise or the like, the generation of the clock stops (S905). If the internal state is not restored, the generation of the clock remains stopped with no recovery (S906).

As described above, in the clock generation circuit of the related art, there is a problem that the circuit may not be reset when the power is turned on even if the power-on reset signal is used to restore the state from the state in which the generation of the clock stops and it is not possible to restore the normal state when a malfunction occurs during a normal operation.

A clock generation circuit according to one aspect of the present invention includes a clock extraction circuit that extracts an extracted clock from an embedded signal on which a clock and data are superimposed, and a stop detection circuit that detects a stop of the extracted clock on the basis of the embedded signal and the extracted clock and outputs a reset signal that resets the clock extraction circuit to an initial state.

A display device drive circuit according to another aspect of the present invention includes a clock extraction circuit that extracts an extracted clock from an embedded signal on which a clock and data are superimposed, a clock output circuit that outputs a recovery clock obtained by performing delay control on the extracted clock, a stop detection circuit that detects a stop of the extracted clock on the basis of the embedded signal and the extracted clock and outputs a reset signal that resets the clock extraction circuit to an initial state, a serial-parallel conversion circuit that converts serial data included in the embedded signal into parallel data on the basis of the recovery clock, and a drive signal output circuit that outputs a drive signal for driving a display device according to the parallel data.

Further, a control method of a clock generation circuit according to still another aspect of the present invention is a control method of a clock generation circuit, which includes a clock extraction circuit that extracts an extracted clock from an embedded signal on which a clock and data are superimposed, and includes the steps of detecting a stop of the extracted clock on the basis of the embedded signal and the extracted clock, and resetting the clock extraction circuit to an initial state when detecting the stop of the extracted clock.

In the aspects of the present invention, a stop of the extracted clock is detected on the basis of the embedded signal and the extracted clock and the clock extraction circuit is reset, so that it is possible to reliably restore a normal state even when the clock stops during a power-on process and a normal operation.

According to the aspects of the present invention, it is possible to provide a clock generation circuit, a display device drive circuit, and a control method of the clock generation circuit, which can reliably recover from a state in which generation of a clock is stopped even during a power-on process and a normal operation.

BRIEF DESCRIPTION OF THE DRAWINGS

FIG. 7 is a timing chart showing an operation of the stop detection circuit according to the embodiment of the present invention;

FIG. 8 is a timing chart showing an operation of the stop detection circuit according to the embodiment of the present invention;

FIG. 12 is a flowchart showing an operation of a clock generation circuit of the related art.

DETAILED DESCRIPTION

Hereinafter, an embodiment of the present invention will be described in detail with reference to the drawings.

Figure 1:
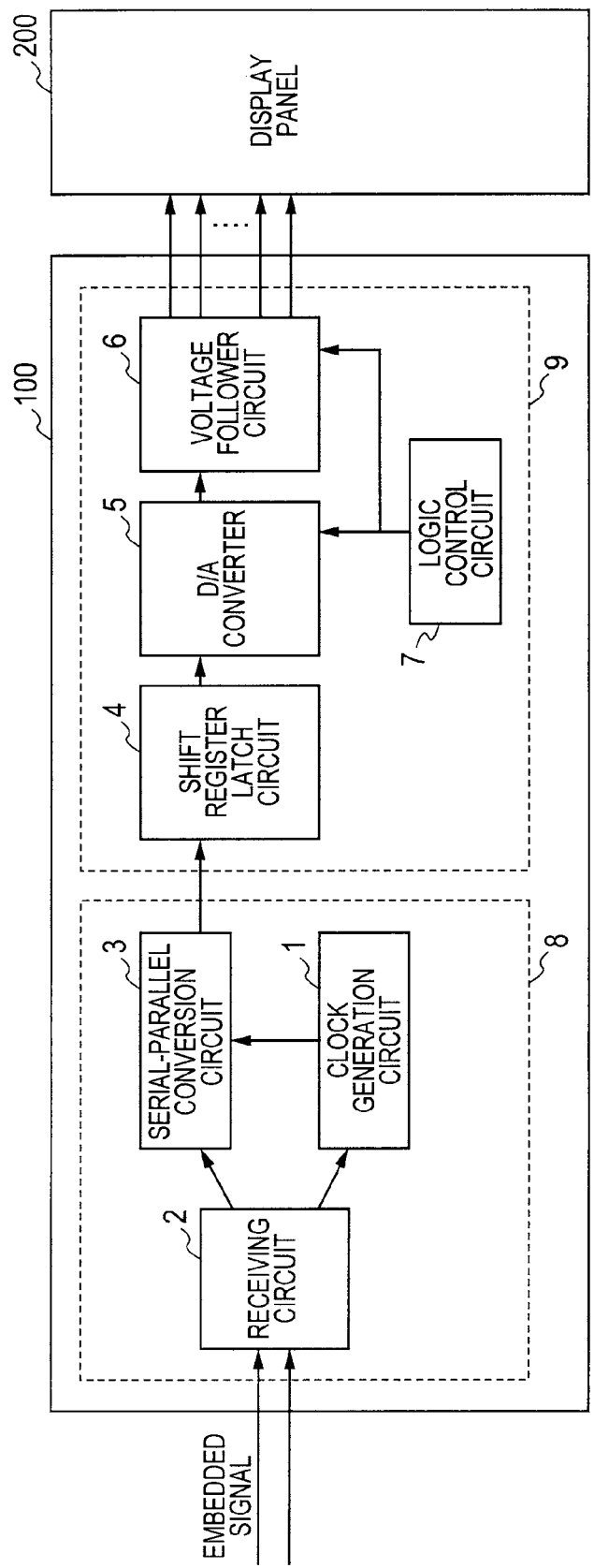
FIG. 1 is a block diagram showing a configuration of a display system according to an embodiment of the present invention.

First, a configuration of a display system according to the embodiment of the present invention will be described with reference to FIG. 1. As shown in FIG. 1, the display system includes a display panel (display device) 200 and a drive device (drive circuit) 100 for driving the display panel.

The display panel 200 drives display pixels according to a drive signal supplied from the drive device 100 and generates a desired display. The display panel 200 is, for example, a liquid crystal display panel, a plasma display panel, or an organic EL display panel. The display panel 200 is provided with a plurality of source lines and a plurality of gate lines to drive a plurality of pixels and the drive signal of the drive device 100 is supplied to the source lines and the gate lines.

An embedded signal including display data and a clock is inputted into the drive device 100 and the drive device 100 outputs a drive signal according to the display data. The drive device 100 includes a clock data recovery circuit 8 and a drive signal output circuit 9. Although the drive device 100 is, for example, a one-chip semiconductor device, each of the clock data recovery circuit 8 and the drive signal output circuit 9 may be a one-chip semiconductor device.

The embedded signal inputted into the drive device 100 is a serial signal received by a high-speed serial I/F, and for example, the embedded signal includes a clock component and a data component separately in a period called data period and includes only the clock component in a period called through period.

The clock data recovery circuit 8 reproduces the clock from the inputted embedded signal and converts the serial signal into a parallel signal. The clock data recovery circuit 8 includes a receiving circuit 2, a serial-parallel conversion circuit 3, and a clock generation circuit 1.

The receiving circuit 2 outputs the inputted embedded signal to the serial-parallel conversion circuit 3 and the clock generation circuit 1. Specifically, the receiving circuit 2 converts the signal inputted as a differential signal into a digital signal formed of high level and low level that can be processed by the serial-parallel conversion circuit 3 and the clock generation circuit 1 and outputs the digital signal. In this example, the embedded signal is a small-amplitude differential signal, so that the receiving circuit 2 is provided. However, if the embedded signal is a CMOS signal, the embedded signal may be directly inputted into the serial-parallel conversion circuit 3 and the clock generation circuit 1 without using the receiving circuit 2.

The clock generation circuit 1 extracts the clock from the inputted embedded signal to generate a recovery clock and outputs the recovery clock to the serial-parallel conversion circuit 3. The clock generation circuit 1 will be described later.

The serial-parallel conversion circuit 3 converts the display data (grayscale signal) of serial signal included in the embedded signal into a parallel signal at timing based on the recovery clock.

The drive signal output circuit 9 outputs a drive signal according to the display data converted into the paralleled signal. The drive signal output circuit 9 includes a shift register latch circuit 4, a D/A converter 5, a voltage follower circuit 6, and a logic control circuit 7.

The shift register latch circuit 4 holds the inputted parallel signals until all the grayscale signals corresponding to the number of outputs are sequentially set in the latch circuit by a shift register and outputs the parallel signals (grayscale signals) to the D/A converter 5 at timing when all the parallel signals (grayscale signals) are set.

The D/A converter 5 has D/A converters, the number of which corresponds to the number of outputs of the drive circuit, converts the parallel signals inputted as digital signals into analog signals according to control of the logic control circuit 7, and outputs the analog signals to the voltage follower circuit 6.

The voltage follower circuit 6 has voltage follower amplifier circuits, the number of which corresponds to the number of outputs of the drive circuit, amplifies the inputted analog signals to generate drive signals according to control of the logic control circuit 7, and outputs the drive signals to the display panel.

Next, the clock generation circuit 1 provided in the clock data recovery circuit 8 of the drive device 100 will be described.

Figure 2:
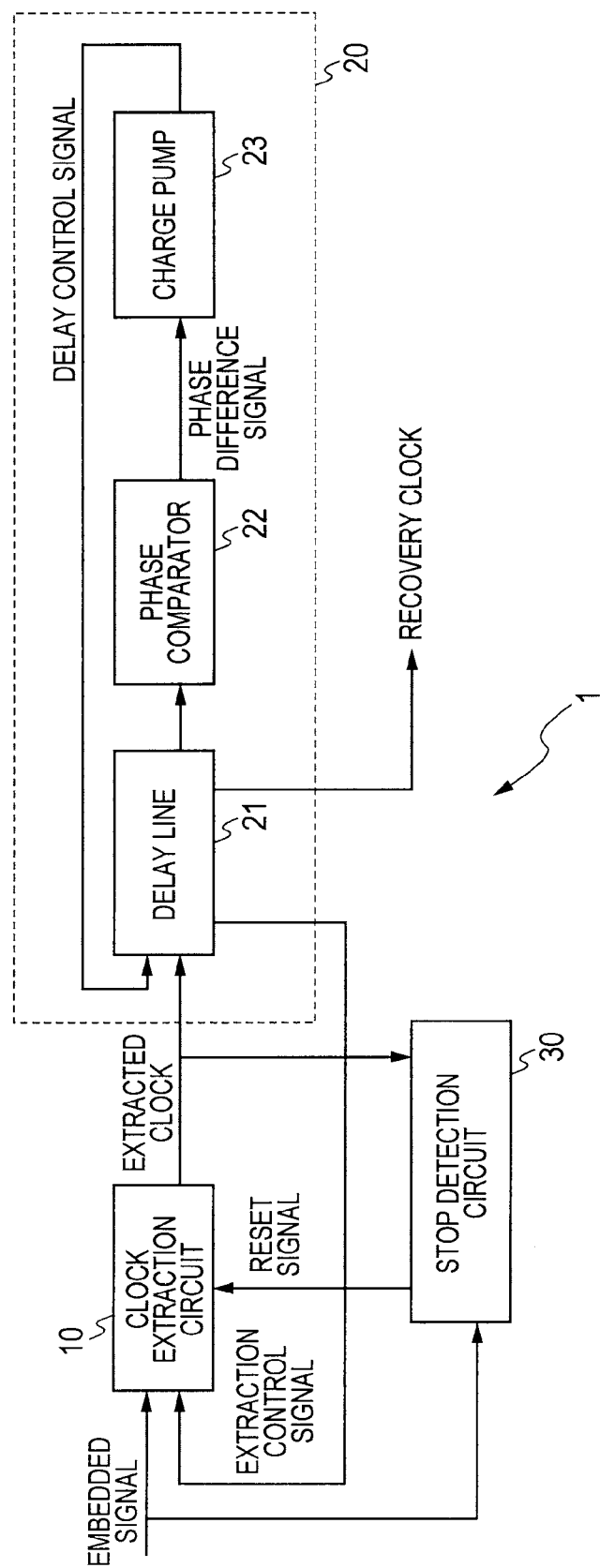
FIG. 2 is a block diagram showing a configuration of a clock generation circuit according to the embodiment of the present invention.

FIG. 2 shows a configuration of the clock generation circuit 1. As shown in FIG. 2, the clock generation circuit 1 includes a clock extraction circuit 10, a DLL (delay locked loop) 20, and a stop detection circuit 30.

The embedded signal and an extraction control signal are inputted into the clock extraction circuit 10. The clock extraction circuit 10 extracts the clock from the inputted embedded signal in an extraction range according to the extraction control signal and outputs the extracted clock as an extracted clock. An internal circuit state in the clock extraction circuit 10 is reset to an initial state by a reset signal. Specifically, a high level signal is inputted as the reset signal, a state of a flip-flop not shown in FIG. 2 and the like are reset.

The DLL 20 is a clock output circuit which performs a delay control on the extracted clock that is extracted by the clock extraction circuit 10 and generates and outputs a recovery clock. For example, the DLL 20 outputs one clock of multiple clocks (multiple clocks) having different phases as a recovery clock. The DLL 20 includes a delay line 21, a phase comparator 22, and a charge pump 23.

The extracted clock and a delay control signal are inputted into the delay line 21. The delay line 21 delays the extracted clock according to the delay control signal to generate a recovery clock. Further, the delay line 21 controls the extraction range of the clock extraction circuit 10 by the extraction control signal. For example, the extraction range is controlled by the recovery clock.

The recovery clock is inputted into the phase comparator 22. The phase comparator 22 detects the phase of the recovery clock and outputs a phase difference signal according to a phase difference. Although not shown in FIG. 2, for example, the phase comparator 22 compares the phases of the recovery clock with the extracted clock and generates a phase difference signal according to the difference of the phases.

The phase difference signal is inputted into the charge pump 23. The charge pump 23 raises the voltage level of the phase difference signal and outputs the phase difference signal as the delay control signal. The amount of delay of the delay line is controlled by the delay control signal.

The extracted clock and the embedded signal are inputted into the stop detection circuit 30. The stop detection circuit 30 detects a stop of the extracted clock on the basis of the extracted clock and the embedded signal. When the stop detection circuit 30 detects the stop of the extracted clock, the stop detection circuit 30 outputs a reset signal to the clock extraction circuit 10.

Hereinafter, the stop detection circuit 30 will be described. First, the extracted clock to be detected by the stop detection circuit 30 will be described.

Figure 3:
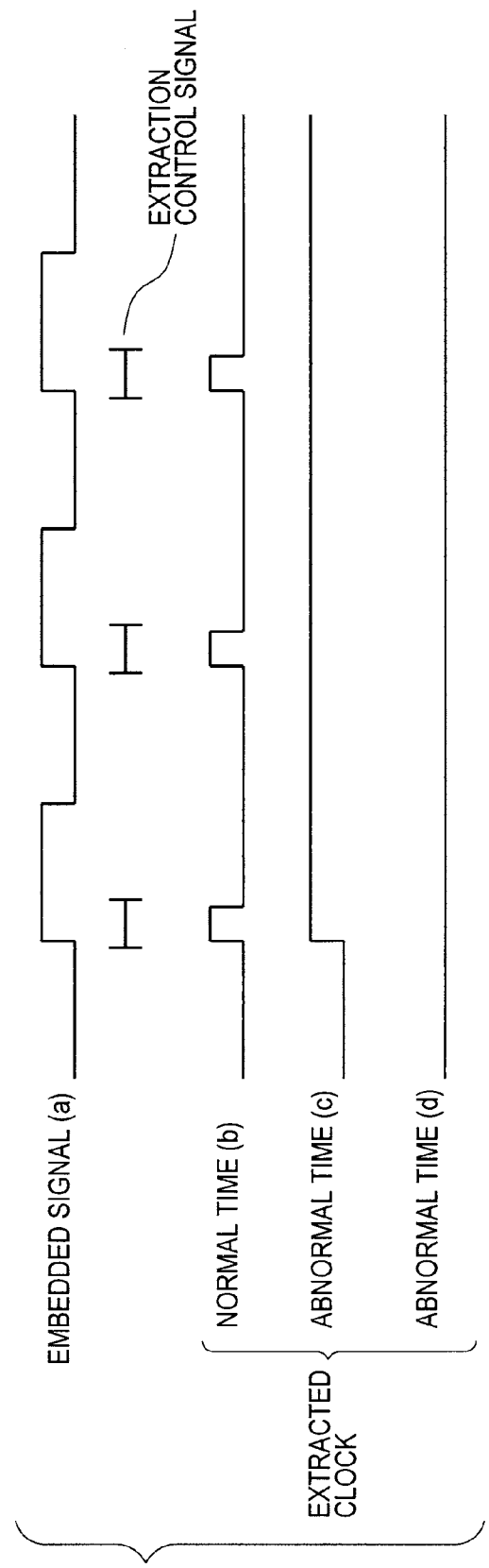
FIG. 3 is a timing chart showing an operation of the clock generation circuit according to the embodiment of the present invention.

FIG. 3 shows extracted clocks when the clock extraction circuit 10 is normal and when the clock extraction circuit 10 is abnormal. As shown by FIG. 3 (*a*), the extraction control signal from the DLL 20 and the embedded signal are inputted into the clock extraction circuit 10.

In normal time, as shown by FIG. 3 (*b*), when the embedded signal is inputted, the clock extraction circuit 10 extracts a clock component in the range controlled by the extraction control signal and generates an extracted clock.

Then, the extracted clock is inputted into the DLL 20 and fed back to the delay line 21 through the delay line 21, the phase comparator 22, and the charge pump 23. If the extracted clock is continuously inputted into the DLL 20, the DLL 20 is in a lock state.

However, there may be an operating condition in which no clock is extracted depending on the state of the internal circuit of the clock extraction circuit 10 and the state of the input from the DLL 20. Specifically, the clock extraction circuit 10 includes an internal circuit for holding the internal state, such as a flip-flop not shown in the drawings, and if the internal state of the circuit becomes unstable and indicates an abnormal value, a malfunction may occur.

During such an abnormal time, the clock extraction circuit 10 cannot normally extract the clock, so that output of the extracted clock stops. As a result, as shown by FIG. 3 (*c*) and FIG. 3 (*d*), the output of the clock extraction circuit 10 remains in a high level or a low level. The state in which no clock component is extracted and no clock component is outputted is called a stop of the extracted clock.

Then, no clock is supplied to the delay line 21, the phase comparator 22, and the charge pump 23, so that no feedback occurs, and the DLL 20 cannot be locked. Therefore, the clock extraction circuit 10 cannot extract the clock due to the internal state and the DLL 20 cannot be locked, so that the clock extraction circuit 10 and the DLL 20 remain in an operation stop state.

In the present invention, in order to reliably recover from this state, the stop detection circuit 30 detects the stop of the extracted clock and resets the clock extraction circuit 10.

Next, an outline of a configuration and an operation of the stop detection circuit 30 of the present invention will be described with reference to FIGS. 4 and 5.

Figure 4:
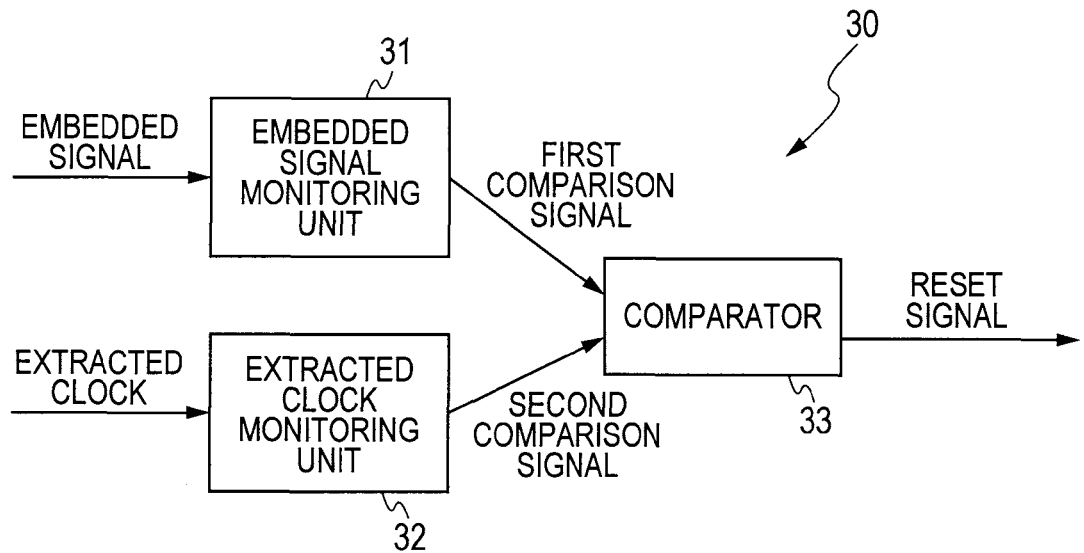
FIG. 4 is a block diagram showing a configuration of a stop detection circuit according to the embodiment of the present invention.
Figure 5:
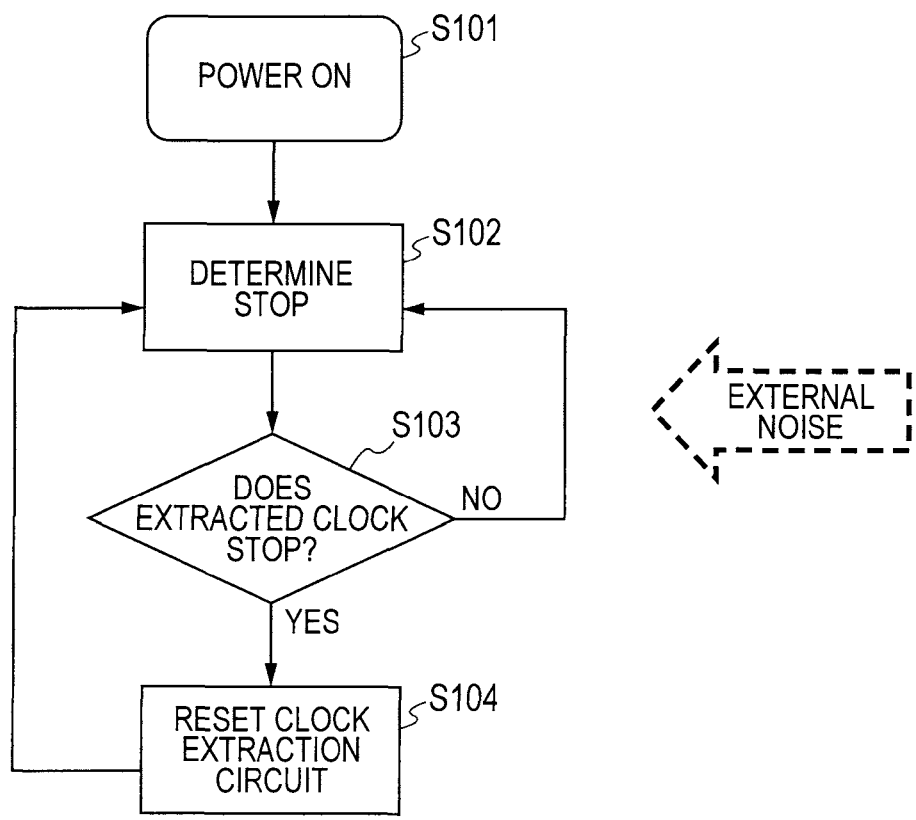
FIG. 5 is a flowchart showing an operation of the stop detection circuit according to the embodiment of the present invention.

As shown in FIG. 4, the stop detection circuit 30 includes an embedded signal monitoring unit 31, an extracted clock monitoring unit 32, and a comparator 33.

The embedded signal is inputted into the embedded signal monitoring unit 31. The embedded signal monitoring unit 31 outputs a first comparison signal based on the embedded signal. The signal based on the embedded signal that is also inputted into the clock extraction circuit 10 is a signal for detecting the stop of the extracted clock and can be compared by the comparator 33.

The extracted clock is inputted into the extracted clock monitoring unit 32. The extracted clock monitoring unit 32 outputs a second comparison signal based on the extracted clock. The signal based on the extracted clock is a signal for detecting the stop of the extracted clock and can be compared by the comparator 33.

For example, even if the signal inputted into the clock generation circuit 1 is an embedded signal by the high-speed serial I/F, the first comparison signal and the second comparison signal are signals having frequencies by which the first comparison signal and the second comparison signal can be compared at a reliable timing.

The comparator 33 compares the first comparison signal and the second comparison signal, detects the stop of the extracted clock on the basis of the comparison result, and outputs the reset signal. In other words, the comparator 33 detects the stop of the extracted clock by comparing a signal level of the signal based on the embedded signal with a signal level of the signal based on the extracted clock. While the first comparison signal based on the embedded signal is detected, if the second comparison signal based on the extracted clock is not detected, the comparator 33 determines that the extracted clock stops. It is guaranteed that a clock edge is inputted in the embedded signal within every certain period of time. On the other hand, the extracted clock whose stop state is checked is the original signal of the system clock (recovery clock) of the display device drive circuit, so that an operating embedded signal needs to be used to detect the stop of the extracted clock. As described above, the stop of the extracted clock can be correctly detected only by comparing the embedded signal and the extracted clock.

The operation of the stop detection circuit 30 will be described. First, when the power of the system including the drive device 100 is turned on (S101), power is supplied to all internal circuits such as the clock extraction circuit 10, the DLL 20, and the stop detection circuit 30, and operations of the circuits start.

In the present embodiment, the receiving circuit 2 and the DLL 20 are analog circuits and the clock extraction circuit 10 and the stop detection circuit 30 are digital circuits. Analog circuits cannot be expected to operate correctly until the power supply voltage reaches a specified value. However, a digital circuit having a simple circuit configuration can operate even while the power supply voltage is still low.

When the power supply voltage exceeds a certain level, the embedded signal is inputted from the outside and the receiving circuit 2 operates. The clock extraction circuit 10 and the stop detection circuit 30 are already ready to operate as described above, so that stop determination of the extracted clock is performed (S102). The stop determination is performed at predetermined intervals as described later. Specifically, the embedded signal monitoring unit 31 generates the first comparison signal based on the embedded signal, the extracted clock monitoring unit 32 generates the second comparison signal based on the extracted clock, and the comparator 33 compares the first comparison signal with the second comparison signal.

Normally, the embedded signal inputted during start-up of the power supply is a signal in which only data including a clock edge changes or a signal in which data of a serial signal changes most frequently (for example, 101010 . . . ).

Immediately after the power on (S101), as described above, it is not expected that the receiving circuit 2 and the DLL 20 which are analog circuits operate normally. Therefore, it is determined that the extracted clock stops (S103, Yes) in the stop determination (S102), and the clock extraction circuit is repeatedly reset (S104). This functions in the same manner as the power-on reset in a technique of the related art. The difference from the technique of the related art is that, when necessary conditions become ready and it is determined that the extracted clock does not stop, the clock extraction circuit is not reset and normal operation starts. As a result, there is an advantage that the start-up time of the display device drive circuit after the power-on is necessary minimum.

If it is determined that the extracted clock does not stop (S103) as a result of the stop determination, the clock extraction circuit is not reset and the stop determination (S102) is repeatedly performed. Specifically, if a signal level of the first comparison signal and a signal level of the second comparison signal correspond to each other, the comparator 33 determines that the extracted clock does not stop, so that the comparator 33 does not output the reset signal. If the signal based on the embedded signal is outputted at high level and the signal based on the extracted clock is also outputted at high level, it is determined that the clock extraction circuit 10 operates normally. If the signal based on the embedded signal is outputted at low level and the signal based on the extracted clock is also outputted at low level, it is also determined that the clock extraction circuit 10 operates normally.

If it is determined that the extracted clock stops (S103) as a result of the stop determination, the clock extraction circuit is reset (S104). In normal operation other than during the power-on process, if the clock extraction circuit 10 is reset, generally, the clock extraction circuit 10 returns to a normal operation by the time of the next stop determination of the extracted clock (S102). Thereafter, the stop determination (S102) is further performed at predetermined intervals described later. Specifically, if the signal level of the first comparison signal and the signal level of the second comparison signal do not correspond to each other, the comparator 33 determines that the extracted clock stops, so that the comparator 33 outputs the reset signal. If the signal based on the embedded signal is outputted at high level and the signal based on the extracted clock is outputted at low level as shown by the abnormal time (d) of the extracted clock in FIG. 3, it is determined that the clock extraction circuit 10 is abnormal. Thereby, for example, it is detected that the extracted clock stops at low level.

It is also possible to detect that the extracted clock stops at high level. For example, if the extracted clock stops at high level as shown by the abnormal time (c) of the extracted clock in FIG. 3, in the same manner as described above, the stop of the extracted clock may be detected as the signal based on the embedded signal is high level and the signal based on the extracted clock is low level and the stop of the extracted clock may be detected as the signal based on the embedded signal is low level and the signal based on the extracted clock is high level.

In this way, the stop of the extracted clock is repeatedly determined at predetermined intervals at all times. Therefore, if the extracted clock is not outputted from the clock extraction circuit during the power-on process, the stop of the extracted clock is detected and the reset is performed, and if the extracted clock is not outputted from the clock extraction circuit due to external noise during the normal operation, the stop of the extracted clock is also detected and the reset is performed.

Next, the configuration and the operation of the stop detection circuit 30 of the present invention will be specifically described with reference to FIGS. 6 to 9.

Figure 6:
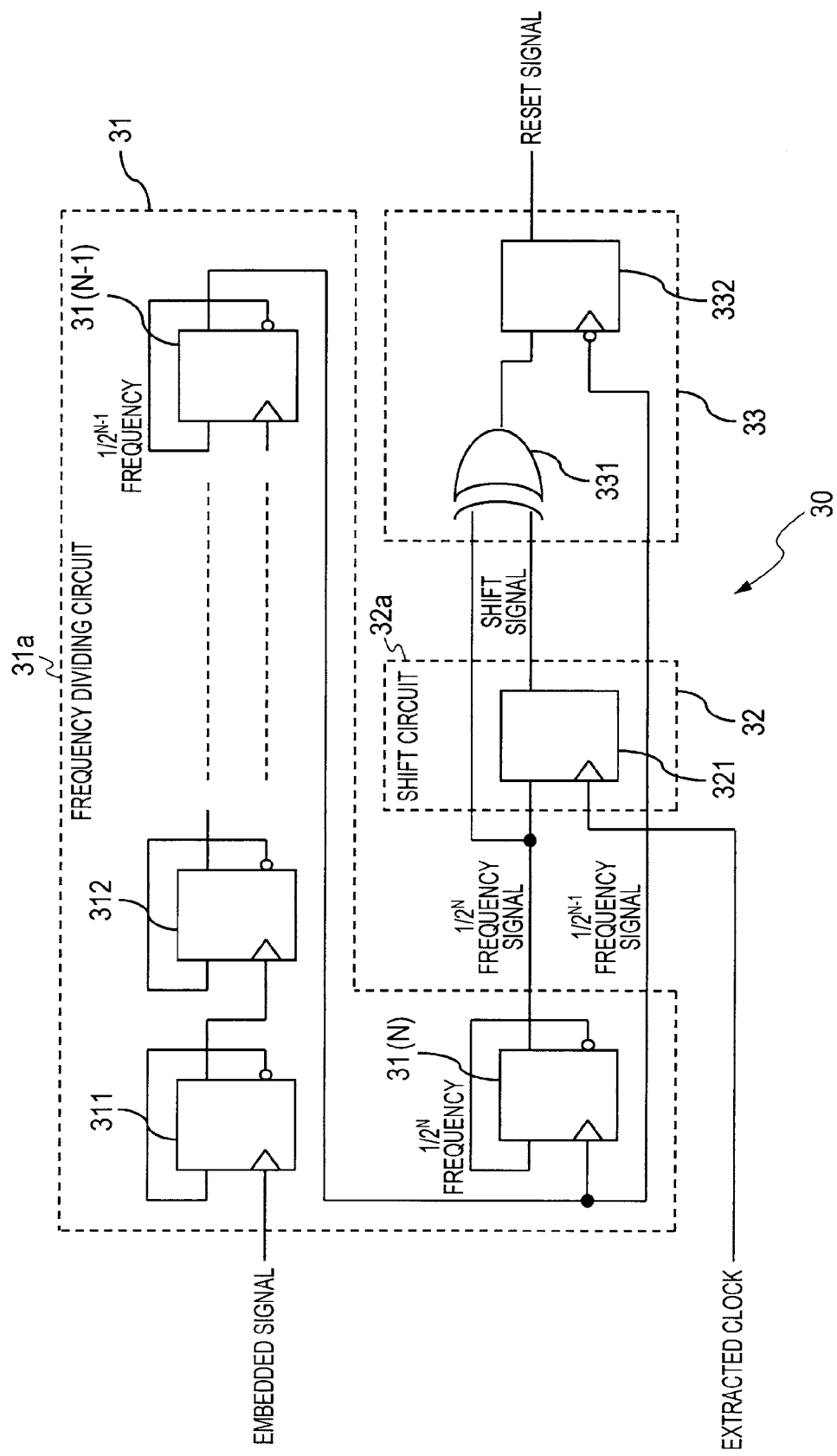
FIG. 6 is a circuit diagram showing a circuit configuration of the stop detection circuit according to the embodiment of the present invention.

As shown in FIG. 6, the embedded signal monitoring unit 31 includes frequency dividing circuit 31a which divides the frequency of the embedded signal by $2^N$. The frequency dividing circuit 31a includes N flip-flops 311 to 31N to divide the frequency by $2^N$. The frequency dividing circuit 31a is also a counter circuit in which multiple flip-flops 311 to 31N are coupled in cascade connection.

The embedded signal is inputted into a clock terminal of the first stage flip-flop 311. In each flip-flop, an inverted output terminal is coupled to a data input terminal and a normal output terminal is coupled to a data input terminal of the next stage flip-flop. A $\frac{1}{2}^N$ frequency signal obtained by dividing the frequency of the embedded signal by $2^N$ is outputted from the normal output terminal of the Nth stage flip-flop 31N. Here, the $\frac{1}{2}^N$ frequency signal of the embedded signal is outputted as the first comparison signal.

As described above, the embedded signal monitoring unit 31 is a frequency dividing circuit and includes a free-run counter, so that the embedded signal monitoring unit 31 can operate regardless of internal states of each flip-flop. Specifically, if the internal states of each flip-flop are unstable due to power-on process or external noise, an initial value of the counter may vary. However, if only the embedded signal is inputted, the counter operates at all times and a frequency-divided signal is generated. Although, in this example, an asynchronous counter which is low power consumption is used, of course, a synchronous counter which uses the embedded signal as an input clock can perform the same function.

The extracted clock monitoring unit 32 includes a shift circuit 32a that shifts the frequency-divided signal. The shift circuit 32a includes one flip-flop 321. The flip-flop 321 latches and outputs the $\frac{1}{2}^N$ frequency signal of the embedded signal according to timing when the extracted clock is inputted. Here, a shifted signal obtained by shifting the $\frac{1}{2}^N$ frequency signal of the embedded signal by the extracted clock is outputted as the second comparison signal. Here, an example is described in which the extracted clock is used as a clock signal (a signal to be tested) of the shift circuit 32a. However, the signal to be tested is not necessarily limited to the extracted clock, but any signal that operates on the basis of the extracted clock may be tested. For example, the recovery clock or the like can be used as a signal to be tested.

The comparator 33 includes an exclusive-OR circuit 331 and a flip-flop 332. The exclusive-OR circuit 331 outputs an operation result obtained by performing an exclusive-OR operation on the $\frac{1}{2}^N$ frequency signal of the embedded signal and the shifted signal obtained by shifting the $\frac{1}{2}^N$ frequency signal by the extracted clock in the flip-flop 321. Specifically, the exclusive-OR circuit 331 outputs low level when the signal levels of the $\frac{1}{2}^N$ frequency signal and the shifted signal are the same, and the exclusive-OR circuit 331 outputs high level when the signal levels of the $\frac{1}{2}^N$ frequency signal and the shifted signal are different.

The flip-flop 332 outputs the operation result of the exclusive-OR circuit 331 at a predetermined timing. The timing of the output is timing based on the embedded signal. Specifically, the timing is timing of the frequency-divided signal of the frequency dividing circuit, and here, the timing is timing of a $\frac{1}{2}^{N-1}$ frequency signal obtained by dividing the frequency of the embedded signal by $2^{N-1}$. The flip-flop 332 latches the output of the exclusive-OR circuit 331 at timing of the falling edge of the $\frac{1}{2}^{N-1}$ frequency signal and outputs the output of the exclusive-OR circuit 331 as the reset signal.

FIG. 7 shows a specific operation of the stop detection circuit of the present invention when the extracted clock is normally extracted.

When the embedded signal is inputted into the frequency dividing circuit 31a as shown by FIG. 7 (a), frequency-divided signals are sequentially outputted from each flip-flop. Specifically, a ½ frequency signal of the embedded signal is outputted from the first stage flip-flop 311, a $\frac{1}{2}^{N-1}$ frequency signal of the embedded signal is outputted from the (N−1)th stage flip-flop 31(N−1) as shown by FIG. 7 (b), and a $\frac{1}{2}^N$ frequency signal of the embedded signal is outputted from the Nth stage flip-flop 31N as shown by FIG. 7 (c).

As shown by FIG. 7 (d), the shift circuit 32a outputs a shifted signal obtained by shifting the $\frac{1}{2}^N$ frequency signal of the embedded signal by the extracted clock. Specifically, a signal latched by the flip-flop 321 at timing of the rising edge of the extracted clock is outputted. Here, the $\frac{1}{2}^N$ frequency signal is shifted by one clock of the extracted clock by the flip-flop 321.

Further, as shown by FIG. 7 (f), at timing of the falling edge of the $\frac{1}{2}^{N-1}$ frequency signal, the $\frac{1}{2}^N$ frequency signal and the shifted signal are high level, so that the reset signal remains to be low level. Specifically, at the timing of the falling edge of the $\frac{1}{2}^{N-1}$ frequency signal, the $\frac{1}{2}^N$ frequency signal and the shifted signal are high level and the output of the exclusive-OR circuit 331 is low level, so that the output of the flip-flop 332 is low level.

As described above, in FIG. 7, the extracted clock does not stop, so that the $\frac{1}{2}^N$ frequency signal is shifted by the extracted clock. The shifted signal and the $\frac{1}{2}^N$ frequency signal before being shifted, which are inputted into the exclusive-OR circuit, are always the same level at the falling edge of the $\frac{1}{2}^{N-1}$ frequency signal, so that the output of the flip-flop is low level at all times. Therefore, while the clock extraction circuit 10 outputs the extracted clock, the reset signal is not inputted into the clock extraction circuit.

FIG. 8 shows a specific operation of the stop detection circuit of the present invention when the extracted clock stops.

In the same manner as in FIG. 7, the frequency dividing circuit 31a outputs the $\frac{1}{2}^N$ frequency signal of the embedded signal as shown by (a) to (c) in FIG. 8. However, here, as shown by FIG. 8 (e), the extracted clock stops due effect of power-on process, external noise, or the like.

Thus, as shown by FIG. 8 (d), the shift circuit 32a does not output the shifted signal obtained by shifting the $\frac{1}{2}^N$ frequency signal. Further, as shown by FIG. 8 (f), at timing of the falling edge of the $\frac{1}{2}^{N-1}$ frequency signal, the $\frac{1}{2}^N$ frequency signal is high level and the shifted signal is low level, so that the reset signal becomes high level, and at the timing of the next falling edge of the $\frac{1}{2}^{N-1}$ frequency signal, the $\frac{1}{2}^N$ frequency signal and the shifted signal are low level, so that the reset signal becomes low level. So, the reset signal repeats high level and low level alternately.

When the reset signal becomes high level, the state of internal circuit of the clock extraction circuit 10 is initialized, so that the clock extraction circuit 10 recovers from the abnormal state and the generation of the extracted clock is started. Then, the operation returns to the state shown in FIG. 7 and the extracted clock is detected, so that the output of the reset signal stops. For example, although, in FIG. 8, two reset signals are outputted, if the generation of the extracted clock is started by one reset signal, only one reset signal is outputted. If the generation of the extracted clock is not started even by the two reset signals, the reset signal is further outputted and the output is repeated until the generation of the extracted clock is started.

In FIG. 8, the extracted clock stops, so that the shifted signal of the shift circuit 32a becomes a fixed value and the $\frac{1}{2}^N$ frequency signal of the embedded signal repeats high level and low level alternately. Therefore, the $\frac{1}{2}^N$ frequency signal and the shifted signal, which are inputted into the exclusive-OR circuit, fail to correspond to each other every two falling edges of the $\frac{1}{2}^{N-1}$ frequency signal, so that the output of the flip-flop repeats high level and low level alternately. Therefore, the input of the reset signal and the release of the reset signal are repeated alternately on the clock extraction circuit 10 at the frequency of the $\frac{1}{2}^N$ frequency signal. The above operation is repeated until the extracted clock starts. Although, in FIG. 8, a case is described in which the extracted clock stops at low level, when the extracted clock stops at high level, also the shifted signal is not generated, so that a similar operation is performed, while the timings of the input and release of the reset signal are reversed.

Here, the extracted clock is detected in a high level period or a low level period of the $\frac{1}{2}^N$ frequency signal of the embedded signal, so that the period of the $\frac{1}{2}^N$ frequency signal needs to be at least longer than the period of the extracted clock. Specifically, the period of the $\frac{1}{2}^N$ frequency signal is longer than a time of one-bit length of a serial signal superimposed on the embedded signal including the extracted clock when the operations of the inputted embedded signal and the clock extraction circuit 10 are normal. FIGS. 7 and 8 shows an example in which the frequency of the embedded signal is divided by 8 ($2^3$) as the $½^N$ frequency of the embedded signal. In this example, it is assumed that the data length of the original serial data included in the embedded signal is 16 bits or less. It is possible to correctly detect the extracted clock by dividing the frequency of the embedded signal by a number larger than the value of the data length of the original serial data included in the embedded signal.

In the embedded signal, according to the value of the superimposed serial data, the same edges as the edge of the first clock, the number of which including the edge of the first clock is up to a half the value of the data length, are generated. It is possible to perform the stop determination of the extracted clock once at most in the period of the original extracted clock by dividing the frequency of the embedded signal by a number larger than the value of the data length of the serial data. Of course, there is a case in which the stop determination does not occur in the period of the original extracted clock when all values of the serial data are the same (only high values or only low values). However, according to the specification of the embedded signal, the edge of the first clock is generated without fail, so that there is no essential problem even though the period of the stop determination becomes somewhat longer.

Figure 9A:
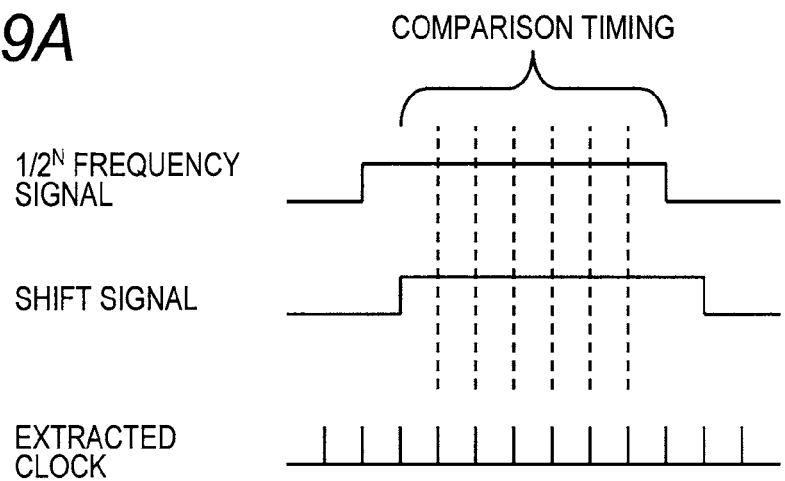
FIGS. 9A and 9B are diagrams for explaining an operation of the stop detection circuit according to the embodiment of the present invention.

In FIGS. 7 and 8, the timing when comparing the $½^N$ frequency signal of the embedded signal and the shifted signal is the timing of the falling edge of the $½^{N-1}$ frequency signal of the embedded signal. The timing is near the center of the high level period or the low level period of the $½^N$ frequency signal, so that the $½^N$ frequency signal and the shifted signal can be reliably compared. As shown in FIG. 9A, the timing when comparing the $½^N$ frequency signal of the embedded signal with the shifted signal may be other timing in which the high level period of the $½^N$ frequency signal and the high level period of the shifted signal overlap each other. However, to compare without failure, it is desired that the signals are compared near the center of the high level periods of both signals as much as possible.

Figure 9B:
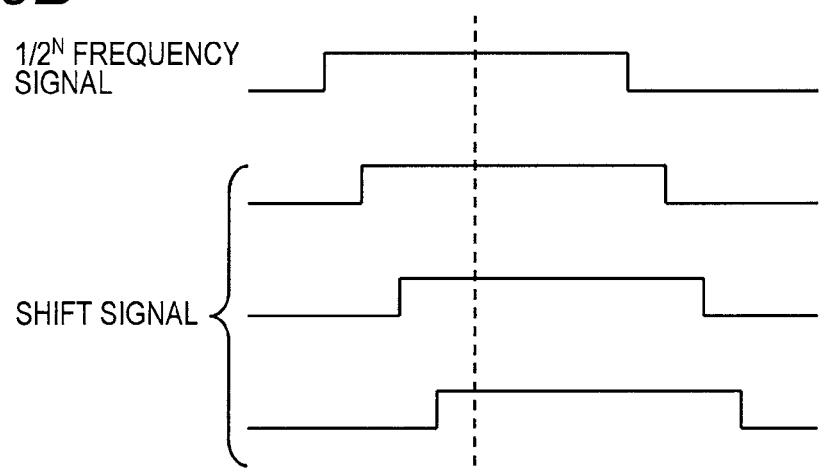
Figure 10:
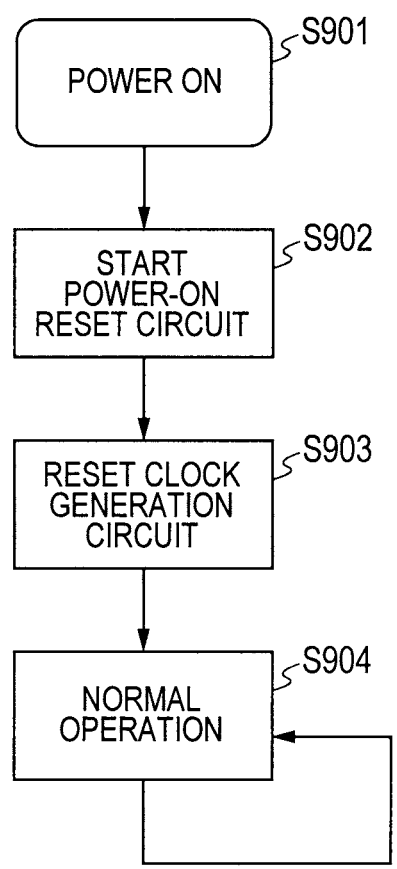
FIG. 10 is a flowchart showing an operation of a clock generation circuit of the related art.
Figure 11:
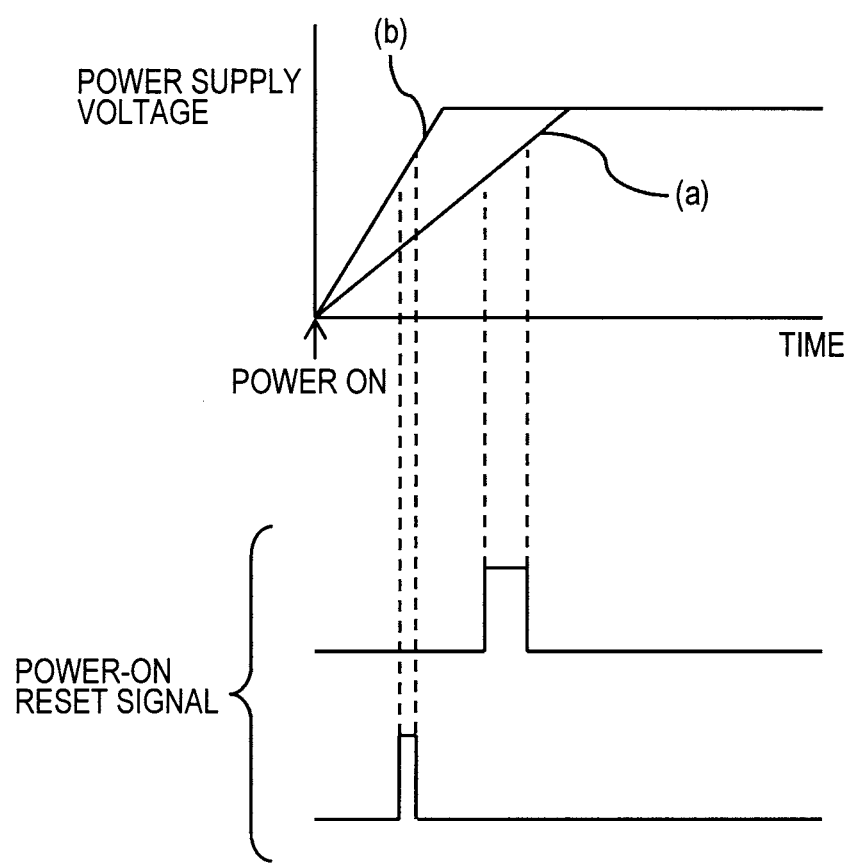
FIG. 11 is a waveform diagram for explaining a power-on reset signal in the clock generation circuit of the related art.

In FIGS. 7 and 8, an example is shown in which the shifted signal is shifted from the $½^N$ frequency signal of the embedded signal by one clock of the extracted clock. As shown in FIG. 9B, the shifted signal may be further shifted from the $½^N$ frequency signal if the signals overlap each other at the timing when the signals are compared. However, to compare without failure, it is desired that the high level periods of both signals overlap each other in as long a period as possible. On the other hand, the $½^N$ frequency signal may be outputted from the shift circuit at timing earlier than one clock.

As described above, in the present invention, the stop of the output of the extracted clock from the clock extraction circuit that extracts a clock from the embedded signal is detected, and the clock extraction circuit is reset. Thereby, even in power-on process or normal operation, the clock extraction circuit is reset, so that it is possible to initialize the internal state of the clock extraction circuit and restart the generation of the extracted clock.

Further, the stop of the extracted clock is detected on the basis of the embedded signal and the extracted clock, so that it is possible to accurately detect the stop of the extracted clock even when the period of the embedded signal is not constant.

It is possible to perform reset while starting up the power supply without using the power-on reset signal as in a manner of the related art and also it is possible to recover the extracted clock even when the extracted clock stops during the normal operation after the reset is completed while starting up the power supply.

To obtain a sufficient power-on reset signal, a time more than necessary is required when starting up the power supply. However, in the present invention, it is possible to complete starting up the power supply with a necessary minimum of waiting time by dividing the frequency of the embedded signal by a number larger than the value of the data length of the original serial data and maximizing the change of data of the embedded signal. Because of the flip-flop and the exclusive-OR circuit, the operation is not affected by the internal state, so that it is possible to detect the stop of the extracted clock and recover the extracted clock by performing reset without being affected by the power-on process, noise, or the like.

The present invention is not limited to the embodiment described above, but may be appropriately modified in a range without departing from the spirit and scope of the invention.

What is claimed is:

1. A clock generation circuit comprising:
   a clock extraction circuit that extracts an extracted clock from an embedded signal on which a clock and data are superimposed; and
   a stop detection circuit that detects a stop of the extracted clock on the basis of the embedded signal and the extracted clock and outputs a reset signal that resets the clock extraction circuit to an initial state,
   wherein the stop detection circuit includes:
   an embedded signal monitoring unit that generates a first comparison signal based on the embedded signal,
   an extracted clock monitoring unit that generates a second comparison signal based on the extracted clock, and
   a comparator that compares the first comparison signal with the second comparison signal and outputs the reset signal based on a result of the comparison.

2. The clock generation circuit according to claim 1, wherein the stop detection circuit outputs the reset signal when the extracted clock is not detected while the embedded signal is detected.

3. The clock generation circuit according to claim 1, wherein the embedded signal monitoring unit is a frequency dividing circuit that divides a frequency of the embedded signal, and
   wherein the first comparison signal is a frequency-divided signal obtained by dividing a frequency of the embedded signal.

4. The clock generation circuit according to claim 3, wherein the data is a serial signal having a fixed data length and the frequency dividing circuit is a frequency dividing circuit that divides the frequency of the embedded signal by a number larger than the data length of the serial signal.

5. The clock generation circuit according to claim 3, wherein the frequency dividing circuit divides the frequency of the embedded signal so that a period of a frequency-divided signal is longer than a period of the extracted clock.

6. The clock generation circuit according to claim 1, wherein the extracted clock monitoring unit generates the second comparison signal based on the extracted clock and the first comparison signal.

7. The clock generation circuit according to claim 6, wherein the extracted clock monitoring unit is a shift circuit that generates the second comparison signal obtained by shifting timing of the first comparison signal according to the extracted clock.

8. The clock generation circuit according to claim 7, wherein the shift circuit includes a flip-flop, and
   wherein the flip-flop latches the first comparison signal according to the extracted clock and outputs the latched signal as the second comparison signal.

9. The clock generation circuit according to claim 1, wherein when a signal level of the first comparison signal and a signal level of the second comparison signal do not correspond to each other, the comparator outputs the reset signal.

10. The clock generation circuit according to claim 9, wherein the comparator includes an exclusive-OR circuit, and
    wherein the exclusive-OR circuit performs an exclusive-OR operation on the first comparison signal and the second comparison signal and outputs a result of the operation as the reset signal.

11. The clock generation circuit according to claim 1, wherein while the extracted clock is outputted, the comparator compares the first comparison signal with the second comparison signal at timing when a high level period of the first comparison signal and a high level period of the second comparison signal overlap each other.

12. The clock generation circuit according to claim 1, wherein the comparator compares the first comparison signal with the second comparison signal at timing based on the embedded signal.

13. The clock generation circuit according to claim 1, wherein the comparator compares the first comparison signal with the second comparison signal at timing of a period shorter than a period of the first comparison signal.

14. The clock generation circuit according to claim 1,
    wherein the first comparison signal is a frequency-divided signal obtained by dividing the frequency of the embedded signal by $2^N$ (N is a natural number), and
    wherein the comparator compares the first comparison signal with the second comparison signal at timing of a frequency-divided signal obtained by dividing the frequency of the embedded signal by $2^{N-1}$.

15. The clock generation circuit according to claim 14, wherein the comparator includes a flip-flop, and
    wherein the flip-flop latches a comparison result of the first comparison signal and the second comparison signal at timing of a frequency-divided signal obtained by dividing the frequency of the embedded signal by $2^{N-1}$ and outputs the latched signal as the reset signal.

16. The clock generation circuit according to claim 1, further comprising:
    a clock output circuit that outputs an extraction control signal that controls an extraction range of a clock,
    wherein the clock extraction circuit extracts an extracted clock from the embedded signal on the basis of the extraction control signal.

17. The clock generation circuit according to claim 1, further comprising:
    a clock output circuit that is a delay locked loop circuit,
    wherein the delay locked loop circuit includes a delay line circuit that generates a delay signal from the extracted clock, a phase comparator that generates a phase difference signal based on a phase difference between the delay signal and the extracted clock, and a charge pump circuit that raises a voltage level of the phase difference signal and controls delay of the delay line circuit.

18. A display device drive circuit comprising:
    a clock extraction circuit that extracts an extracted clock from an embedded signal on which a clock and data are superimposed;
    a clock output circuit that outputs a recovery clock obtained by performing delay control on the extracted clock;
    a stop detection circuit that detects a stop of the extracted clock on the basis of the embedded signal and the extracted clock and outputs a reset signal that resets the clock extraction circuit to an initial state;
    a serial-parallel conversion circuit that converts serial data included in the embedded signal into parallel data on the basis of the recovery clock; and
    a drive signal output circuit that outputs a drive signal for driving a display device according to the parallel data,
    wherein the stop detection circuit includes:
    an embedded signal monitoring unit that generates a first comparison signal based on the embedded signal,
    an extracted clock monitoring unit that generates a second comparison signal based on the extracted clock, and
    a comparator that compares the first comparison signal with the second comparison signal and outputs the reset signal based on a result of the comparison.

19. A control method of a clock generation circuit including a clock extraction circuit that extracts an extracted clock from an embedded signal on which a clock and data are superimposed, the control method comprising the steps of:
    detecting a stop of the extracted clock on the basis of the embedded signal and the extracted clock;
    generating a first comparison signal based on the embedded signal,
    generating a second comparison signal based on the extracted clock,
    comparing the first comparison signal with the second comparison signal and detecting the stop of the extracted clock based on a result of the comparison, and
    resetting the clock extraction circuit to an initial state when detecting the stop of the extracted clock.

* * * * *